United States Patent [19]

Lehrer et al.

[11] 4,387,145
[45] Jun. 7, 1983

[54] LIFT-OFF SHADOW MASK

[75] Inventors: William I. Lehrer, Los Altos; John H. Vincak, Mountain View, both of Calif.

[73] Assignee: Fairchild Camera & Instrument Corp., Mountain View, Calif.

[21] Appl. No.: 306,116

[22] Filed: Sep. 28, 1981

[51] Int. Cl.³ .................. G03C 5/00; G03F 5/00; B44C 1/22

[52] U.S. Cl. .................. 430/5; 430/314; 430/323; 430/324; 156/628; 156/643; 156/652; 156/653; 156/655; 156/657

[58] Field of Search ............... 430/314, 323, 324, 5; 156/653, 652, 628, 643, 655, 657

[56] References Cited

U.S. PATENT DOCUMENTS 3,669,661  6/1972  Page et al. .................. 430/314
4,108,717  8/1978  Widmann .................... 430/314
4,307,179  12/1981  Chang et al. ................. 430/314

Primary Examiner—Richard L. Schilling
Attorney, Agent, or Firm—Kenneth Olsen; Michael J. Pollock; Theodore S. Park

[57] ABSTRACT

A method for forming a predetermined configuration of a film material comprises the steps of forming a layer of a first material on a surface, forming a layer of a second material on the first material wherein the first material has an etch rate greater than that of the second material when the first material and the second material are exposed to a common etchant, etching portions of the second material and underlying portions of the first material to expose portions of the surface, forming a layer of film material on the exposed portions of the surface, forming a layer of film material on the exposed portions of the surface and on the remaining portions of the second material, and removing the remaining portions of the first material such that the overlying second material and the film material thereon is also removed.

8 Claims, 7 Drawing Figures

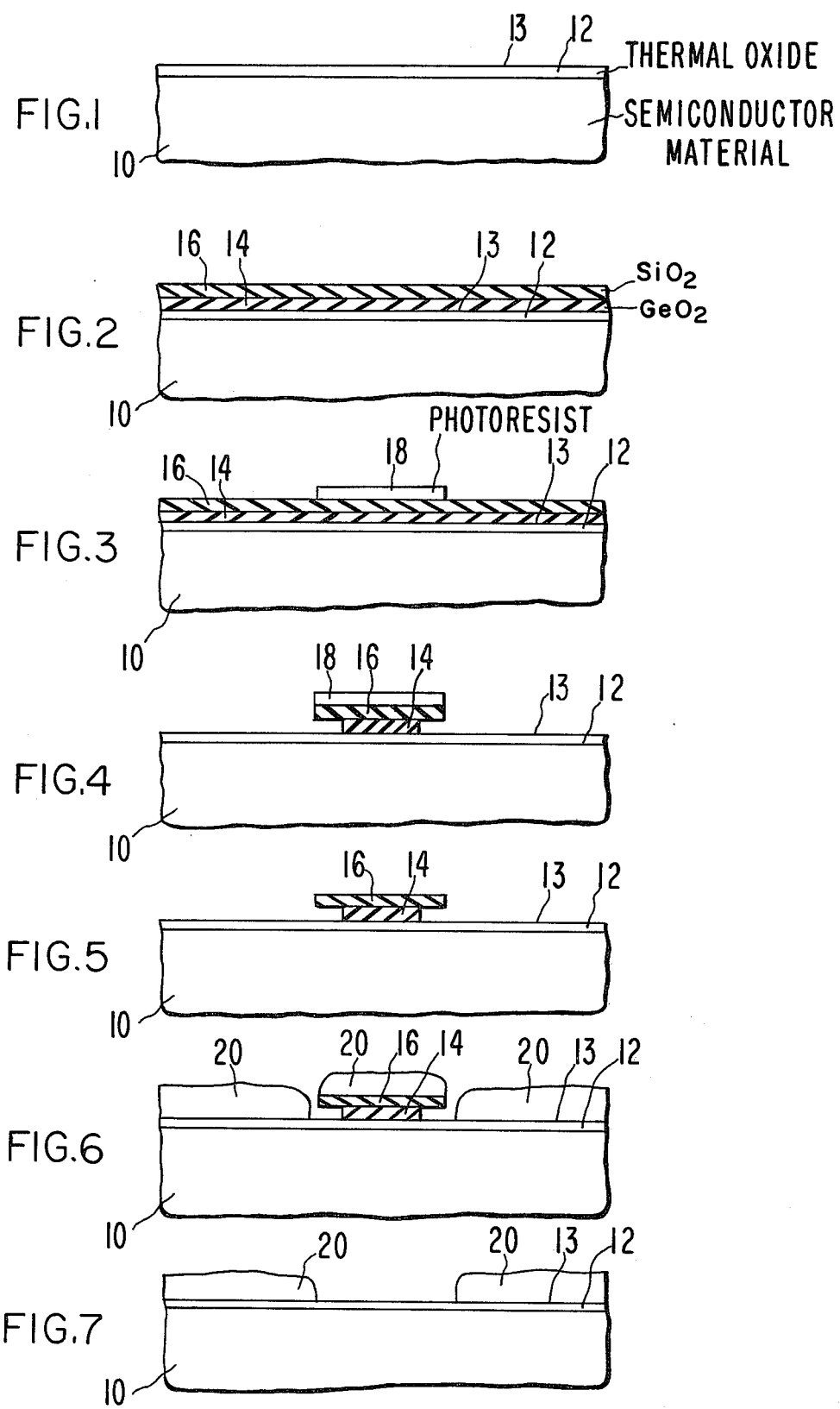

LIFT-OFF SHADOW MASK

TECHNICAL FIELD

This invention relates to the manufacture of devices by photofabrication and particularly to a process for forming masks employed in such manufacture.

BACKGROUND

In many arts, such as the semiconductor art, a film or layer of material is formed into a predetermined configuration on a selected surface. For example, after forming an integrated circuit on a surface of a semiconductor chip, it is necessary to make electrical contact with the numerous elements or regions of the circuit. Such contact may be accomplished by forming a predetermined configuration of contacting material over the surface of the integrated circuit, the contacting material being separated from the surface by a layer of dielectric.

In other instances, it is desired that a predetermined configuration in the form of a narrow cut in a passivating layer of material, for example silicon monoxide, may be made incident to forming a device in or on a substrate. In other instances, independent masks, that is, masks not on the surface of an actual device, are formed for employment in exposing and processing of an actual device. Each of these various applications may involve the formation of a film or layer of material into a predetermined configuration.

It is well known to form predetermined configurations of a film of material by etching, by lifting or by a combination of these techniques. Lifting processes involve depositing the film of material partially upon a surface and partially upon a lifting materials which is formed in a pattern upon the surface. The lifting material is then removed along with the film material deposited thereover leaving a desired pattern of the film material on the surface.

When a film material is applied to the lifting material and the exposed portion of the surface, the film material takes a continuous form. Thus, when the lifting material is removed, the layer of film material must be broken. Breaking of the film material creates problems not only in its precise definition but also in its functional characteristics.

SUMMARY OF THE INVENTION

The present invention provides a method for forming a lift-off shadow mask which permits formation of a film material of precisely-defined predetermined configuration. The method relies on the sequential chemical vapor deposition of two different semiconductor insulating oxides, the lowermost of which exhibits a faster etch rate when the two oxides are exposed to a common etchant. By simultaneously etching the dual oxide structure utilizing a common etchant, preferably $CF_4$-based plasma, an undercut shadow-mask geometry is produced.

The shadow-mask structure formed by the preferred method of the present invention offers the advantages of being water-removable and serviceable to deposition temperatures of up to 800° C. for short periods. According to the preferred method, silane ($SiH_4$) and germane ($GeH_4$) are employed as source gases in a commercial chemical vapor deposition reactor to produce a layered structure of silicon dioxide ($SiO_2$) and underlying a germanium dioxide ($GeO_2$).

BRIEF DESCRIPTION OF THE DRAWINGS

FIG. 1 is a cross-section of a semiconductor substrate having a layer of thermal oxide formed thereon.

FIG. 2 is a cross-section as in FIG. 1 having a layer of germanium dioxide formed on the thermal oxide layer and a layer of silicon dioxide formed on the germanium dioxide layer.

FIG. 3 is a cross-section as in FIG. 2 having a layer of patterned photoresist formed thereon.

FIG. 4 is a cross-section showing the structure of FIG. 3 following etching of the silicon dioxide and germanium dioxide layers utilizing a common etchant.

FIG. 5 is a cross-section as in FIG. 4 following removal of the photoresist.

FIG. 6 is a cross-section as in FIG. 5 following deposition of film material.

FIG. 7 is a cross section as in FIG. 6 following removal of the silicon dioxide and germanium dioxide.

BEST MODE OF CARRYING OUT THE INVENTION

FIG. 1 shows a substrate 10 of semiconductor material. A layer 12 of thermal oxide having an upper surface 13 is formed on the substrate 10.

According to the method of the present invention, a layer 14 of germanium dioxide is formed on the surface 13 followed by the formation of an overlying layer 16 of silicon dioxide as shown in FIG. 2. Preferably, both germanium dioxide layer 14 and silicon dioxide layer 16 are formed by chemical vapor deposition.

The germanium dioxide layer 14 is deposited in a conventional CVD reactor which is maintained at about 400° C. Nitrogen gas is introduced to the reactor at a flow rate of about 40 liters/min. Oxygen is introduced to the reactor at a flow rate of about 1.5 liters/min. Germane is introduced to the reactor at a flow rate of about 15 cc/min, that is, such that the ratio of oxygen to germane is about 100:1. Germanium dioxide layer 14 is deposited on surface 13 at a rate of about 200 A°/min to a thickness of about 7500 A°.

Following deposition of germanium dioxide layer 14, silicon dioxide layer 16 is deposited by maintaining the reactor at about 400° C. and introducing nitrogen gas at a flow rate of about 40 liters/min. Oxygen is introduced to the reactor at a flow rate of about 1.5 liters/min. Silane is introduced to the reactor at a flow rate of about 15 cc/min, that is, such that the ratio of oxygen to silane is about 100:1. Silicon dioxide layer 16 is deposited on the germanium dioxide layer 14 at a rate of about 1000 A°/min to a thickness of about 2500 A°.

Utilizing conventional photolithographic techniques, a patterned layer of photoresist is formed as shown in FIG. 3. The photoresist material may be a photoresist such as AZ. The photoresist is applied in the form of a continuous layer by standard photoresist coating apparatus. The photoresist is then exposed and developed according to well-known photoengraving techniques leaving an image 18 of the photoresist material such as shown in FIG. 3.

Next, as shown in FIG. 4, exposed areas of the silicon dioxide layer 16 and the underlying germanium dioxide layer 14 are removed. Utilizing a $CF_4$-based plasma, germanium dioxide exhibits 5 to 10 times the etch rate of undoped silicon dioxide. Therefore, it is possible to deposit the layered structure shown in FIG. 2, mask with photoresist and then dry etch in a $CF_4$-based plasma reactor to produce the undercut shadow-mask structure shown in FIG. 4. According to the preferred method, the silicon dioxide and germanium dioxide are etched in an IPC Barrel Etcher utilizing a 4% $CF_4/O_2$ plasma at about 0.4 Torr and about 300-400 watts.

The photoresist 18 is then removed, preferably by "ashing" in an $O_2$ plasma, to expose the underlying silicon dioxide layer 16 as shown in FIG. 5.

The film material 20 to be patterned is then deposited upon the exposed surface of silicon dioxide layer 16 and upon the exposed portions of the surface 13 of the thermal oxide layer 12. As shown in FIG. 6, in the preferred embodiment, following the deposition of film material 20, a gap or pocket exists beneath the undercut portion of silicon dioxide layer 16. The entire structure is then immersed in water. Since germanium dioxide produced in the abovedescribed manner is completely soluble in water while silicon dioxide is insoluble in water, the germanium dioxide layer is dissolved carrying with it the overlying silicon dioxide and leaving the patterned film material 20 as shown in FIG. 7.

There are several salient advantages to the abovedescribed process. First, the lift-off film, that is, silicon dioxide/germanium dioxide, can be deposited in large volumes by low pressure chemical vapor deposition techniques. Second, the materials used are "clean dielectrics" and will not cause any contamination even if used at high temperature. Third, the lift off solvent is water which is a distinct advantage. Fourth, since germanium dioxide and silicon dioxide are compatible oxide materials, mixtures can be made to vary the degree of etch rate and the geometry of the indentation.

I claim:

1. A method for forming a predetermined configuration of a film material comprising:
   (a) forming a layer of germanium dioxide on a surface;
   (b) forming a layer of a second material on said layer of germanium dioxide, said germanium dioxide having an etch rate greater than that of said second material when said germanium dioxide and said second material are exposed to a common etchant;
   (c) etching portions of said second material and underlying portions of said germanium dioxide utilizing a common etchant to expose portions of said surface;
   (d) forming a layer of film material on said exposed portions of said surface and on remaining portions of said layer of second material; and
   (e) removing remaining portions of said germanium dioxide such that overlying second material and film material thereon are also removed.

2. A method as in claim 1 wherein said second material is silicon dioxide.

3. A method as in claim 2 wherein said etching is accomplished by plasma etching.

4. A method as in claim 3 wherein said common etchant is $CF_4$-based plasma.

5. A method for forming a predetermined configuration of a film material comprising:
   (a) forming a layer of a water-soluble material on a surface;
   (b) forming a layer of a water-insoluble material on said layer of water-soluble material, said water-soluble material having an etch rate greater than that of said water-insoluble material when said materials are exposed to a common etchant;
   (c) covering said layer of water-insoluble material with photoresist and patterning said photoresist to expose portions of said layer of water-insoluble material;
   (d) plasma etching said exposed portions of said layer of water-insoluble material and underlying portions of said layer of water-soluble material utilizing a common etchant to expose portions of said surface;
   (e) forming a layer of film material on said exposed portions of said surface and on remaining portions of said layer of water-insoluble material;
   (f) immersing remaining portions of said water-soluble layer in water to dissolve said remaining portions of said water-soluble layer such that said overlying remaining portions of said water-insoluble layer and film material thereon are removed.

6. A method as in claim 5 wherein said water-soluble material is germanium dioxide.

7. A method as in claim 6 wherein said water-insoluble material is silicon dioxide.

8. A method as in claim 7 wherein said plasma is a $CF_4$-based plasma.

* * * * *